United States Patent
Cheng et al.

(10) Patent No.: US 12,336,207 B2
(45) Date of Patent: Jun. 17, 2025

(54) SEMI-CONDUCTOR STRUCTURE AND MANUFACTURING METHOD THEREOF

(71) Applicant: ENKRIS SEMICONDUCTOR, INC., Jiangsu (CN)

(72) Inventors: Kai Cheng, Jiangsu (CN); Dandan Zhu, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 512 days.

(21) Appl. No.: 17/783,382

(22) PCT Filed: Jun. 3, 2020

(86) PCT No.: PCT/CN2020/094174
§ 371 (c)(1),
(2) Date: Jun. 8, 2022

(87) PCT Pub. No.: WO2021/243603
PCT Pub. Date: Dec. 9, 2021

(65) Prior Publication Data
US 2023/0015133 A1   Jan. 19, 2023

(51) Int. Cl.
*H10D 30/01* (2025.01)
*H01L 21/223* (2006.01)
(Continued)

(52) U.S. Cl.
CPC ....... *H10D 30/015* (2025.01); *H01L 21/2233* (2013.01); *H10D 30/475* (2025.01);
(Continued)

(58) Field of Classification Search
None
See application file for complete search history.

(56) References Cited

U.S. PATENT DOCUMENTS

| 8,962,409 B2 | 2/2015 | Tomabechi |
| 2008/0087915 A1 | 4/2008 | Uemoto et al. |

(Continued)

FOREIGN PATENT DOCUMENTS

| CN | 103022119 A | 4/2013 |
| CN | 103077890 A | 5/2013 |

(Continued)

OTHER PUBLICATIONS

Machine Translation of CN110518067A (Year: 2019).*

(Continued)

*Primary Examiner* — Yara B Green
*Assistant Examiner* — Fakeha Sehar
(74) *Attorney, Agent, or Firm* — Christopher R. Carroll; The Small Patent Law Group LLC

(57) ABSTRACT

Provided are a semi-conductor structure and a manufacturing method thereof. The semi-conductor structure includes: a substrate, a heterojunction, a P-type ion doped layer and a gate insulation layer disposed from bottom to top, wherein the heterojunction includes a source region, a drain region and a gate region; the P-type ion doped layer in the gate region includes an activated region and non-activated regions, P-type doping ions in the activated region are activated, and P-type doping ions in the non-activated regions are passivated; the non-activated regions include at least two regions which are spaced apart in a direction perpendicular to a connection line of the source region and the drain region; the gate insulation layer is located on the non-activated region to expose the activated region.

20 Claims, 6 Drawing Sheets

(51) Int. Cl.
*H10D 30/47* (2025.01)
*H10D 62/10* (2025.01)
*H10D 62/824* (2025.01)
*H10D 62/85* (2025.01)
*H10D 62/854* (2025.01)

(52) U.S. Cl.
CPC ......... *H10D 62/105* (2025.01); *H10D 62/824* (2025.01); *H10D 62/8503* (2025.01); *H10D 62/854* (2025.01)

(56) References Cited

U.S. PATENT DOCUMENTS

| | | |
|---|---|---|
| 2013/0075750 A1 | 3/2013 | Minoura |
| 2013/0075788 A1 | 3/2013 | Tomabechi |

FOREIGN PATENT DOCUMENTS

| | | | | |
|---|---|---|---|---|
| CN | 110518067 A | * | 11/2019 | ......... H01L 29/1029 |
| CN | 110690284 A | | 1/2020 | |
| CN | 110970499 A | | 4/2020 | |

OTHER PUBLICATIONS

ISA State Intellectual Property Office of the People's Republic of China, International Search Report Issued in Application No. PCT/CN2020/094174, Mar. 15, 2021, WIPO, 5 pages.
ISA State Intellectual Property Office of the People's Republic of China, Written Opinion of the International Searching Authority Issued in Application No. PCT/CN2020/094174, Mar. 15, 2021, WIPO, 6 pages.(Submitted with Machine/ Partial Translation).

* cited by examiner

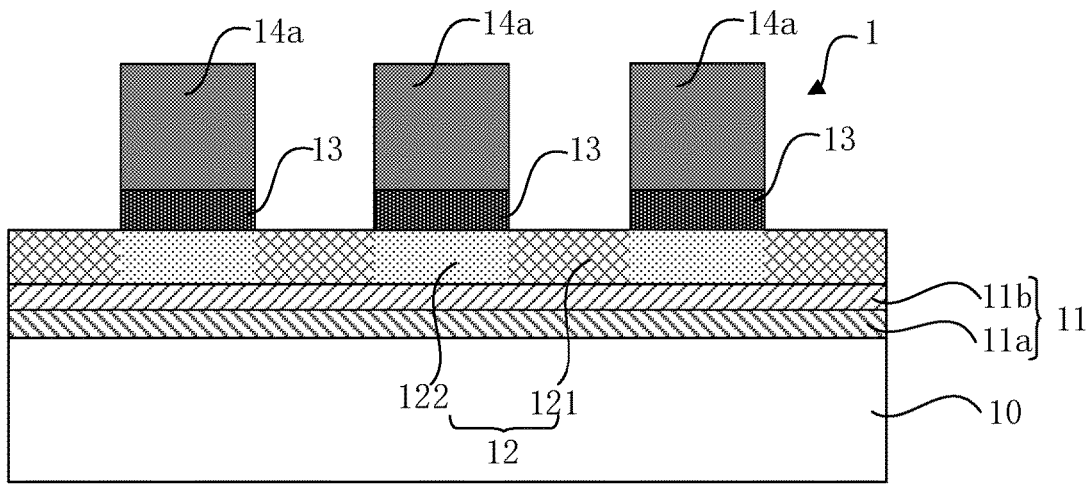

FIG.3

| A substrate is provided, on which a heterojunction, a P-type ion doped layer and an insulation material layer are sequentially formed; where the heterojunction includes a source region, a drain region and a gate region between the source region and the drain region. | S1 |
|---|---|
| The gate insulation layer is formed by patterning the insulation material layer to expose a region of the P-type ion doped layer; the gate insulation layer includes at least two regions which are spaced apart in a direction perpendicular to a connection line of the source region and the drain region. | S2 |
| The P-type doping ions in the exposed P-type ion doped layer are activated with the gate insulation layer as a mask, so as to form the activated region. | S3 |
| Gate electrodes are formed on the gate insulation layer, a source electrode is formed in the source region of the heterojunction, and a drain electrode is formed in the drain region of the heterojunction. | S4 |

FIG.4

SEMI-CONDUCTOR STRUCTURE AND MANUFACTURING METHOD THEREOF

CROSS-REFERENCE TO RELATED APPLICATIONS

This application is a national phase entry of and claims priority to International Patent Application No. PCT/CN2020/094174 (filed 3 Jun. 2020), the entire subject matter of which is incorporated herein by reference.

TECHNICAL FIELD

The present disclosure relates to the field of semi-conductor technologies, and in particular to a semi-conductor structure and a manufacturing method thereof.

BACKGROUND

Wide-bandgap semi-conductor material III-nitride, as a typical representative of the third-generation semi-conductor materials, have excellent characteristics of large bandgap, high pressure resistance, high temperature resistance, high electron saturation velocity and drift velocity, and easy formation of high-quality heterostructure, and thus are very suitable for manufacturing of electronic devices with high temperature, high frequency and large power.

For example, AlGaN/GaN heterojunctions are widely applied to semi-conductor structures such as High Electron Mobility Transistors (HEMT) due to high-concentration two-dimensional electron gas (2DEG) existing at an AlGaN/GaN interface caused by relatively strong spontaneous polarization and piezoelectric polarization.

Enhanced devices are widely applied in the field of power electronics due to their normally-off characteristics. The enhanced devices may be implemented in many manners. For example, the 2DEG is depleted by disposing a P-type semi-conductor at a gate electrode.

In a planar device, an electric current flows along a plane in a quantum well formed by heterojunctions. Under a reverse bias condition, the electric field distribution of the device is usually non-uniform. Generally, severe electric field concentration will be generated at an edge of a gate electrode or an edge of a drain electrode, and the electric field strength at this position will increase rapidly along with increase of a reverse voltage. When up to a critical breakdown field strength, the device is broken down.

A higher breakdown voltage means that the device has a larger working voltage range, can obtain a higher power density, and has higher reliability. Therefore, how to increase a breakdown voltage of a device is a hot topic of electronic device researchers.

BRIEF SUMMARY

However, the inventor of the present disclosure finds that in the method of implementing an enhanced device by disposing a P-type semi-conductor at a gate electrode, it is required to etch the P-type semi-conductor outside a gate region, but the etching will inevitably bring etching loss. In addition, a breakdown voltage of the enhanced device needs to be improved.

To solve the above problem, an aspect of the present disclosure provides a semi-conductor structure, including:

a substrate, a heterojunction, a P-type ion-doped layer and a gate insulation layer disposed from bottom to top. The heterojunction includes a source region, a drain region and a gate region between the source region and the drain region. The P-type ion doped layer in the gate region includes an activated region and non-activated regions, P-type doping ions in the activated region are activated, and P-type doping ions in the non-activated regions are passivated. The non-activated regions include at least two regions which are spaced apart in a direction perpendicular to a connection line of the source region and the drain region. The gate insulation layer is located on the non-activated regions to expose the activated region.

Optionally, the semi-conductor structure further includes a source electrode, a drain electrode and gate electrodes. The gate electrodes are located on the gate insulation layer, the source electrode is located in the source region of the heterojunction, and the drain electrode is located in the drain region of the heterojunction.

Optionally, the gate electrodes are electrically connected together.

Optionally, the P-type ion doped layer in the drain region includes a drain-region activated region, in which P-type doping ions are activated.

Optionally, the semi-conductor structure further includes a source electrode, a drain electrode and gate electrodes. The gate electrodes are located on the gate insulation layer, the source electrode is located in the source region, and the drain electrode is located in the drain-region activated region and the drain region.

Optionally, the gate electrodes are electrically connected together.

Optionally, the heterojunction includes a channel layer and a barrier layer from bottom to top.

Optionally, the heterojunction includes a channel layer and a barrier layer from bottom to top; the source electrode and the drain electrode are in contact with the channel layer or the barrier layer.

Optionally, a material of the P-type ion doped layer includes a III-nitride material.

Optionally, the gate insulation layer is of single-layer structure or a multiple-layer stack structure.

Another aspect of the present disclosure provides a method of manufacturing a semi-conductor structure, including:

providing a substrate, and sequentially forming a heterojunction, a P-type ion doped layer and an insulation material layer on the substrate, where the heterojunction includes a source region, a drain region, and a gate region between the source region and the drain region;

forming a gate insulation layer by patterning the insulation material layer to expose a part of the P-type ion doped layer, where the gate insulation layer includes at least two regions which are spaced apart in a direction perpendicular to a connection line of the source region and the drain region; and forming an activated region by activating P-type doping ions in the exposed part of the P-type ion doped layer with the gate insulation layer as a mask.

Optionally, the P-type doping ions are activated by annealing at a temperature greater than 500° C.

Optionally, the P-type doping ions are activated in an atmosphere of nitrogen, a mixed gas of nitrogen and oxygen, nitrous oxide or argon.

Optionally, the manufacturing method further includes: forming gate electrodes on the gate insulation layer, forming a source electrode in the source region of the heterojunction, and forming a drain electrode in the drain region of the heterojunction.

Optionally, when the P-type doping ions in the exposed P-type ion doped layer are activated with the gate insulation layer as the mask, the P-type ion doped layer in the drain region is also activated to form a drain-region activated region.

Optionally, the manufacturing method further include: forming gate electrodes on the gate insulation layer, forming a source electrode in the source region, and forming a drain electrode in the drain-region activated region and the drain region.

Optionally, the heterojunction includes a channel layer and a barrier layer from bottom to top.

Optionally, the heterojunction includes a channel layer and a barrier layer from bottom to top; the source electrode and the drain electrode are in contact with the channel layer or the barrier layer.

Optionally, a material of the P-type ion doped layer includes a III-nitride material.

Optionally, the gate insulation layer is of single-layer structure or a multiple-layer stack structure.

Compared with the prior art, the present disclosure has the following beneficial effects.

1. The semi-conductor structure of the present disclosure includes: a substrate, a heterojunction, a P-type ion doped layer and a gate insulation layer disposed from bottom to top. The heterojunction includes a source region, a drain region and a gate region, the P-type ion doped layer in the gate region includes an activated region and non-activated regions, P-type doping ions in the activated region are activated, and P-type doping ions in the non-activated regions are passivated. The non-activated regions include at least two regions which are spaced apart in a direction perpendicular to a connection line of the source region and the drain region. The gate insulation layer is located in on the non-activated region to expose the activated regions. The gate insulation layer is used as a mask layer for activating the P-type doping ions so that a region of the P-type ion doped layer not covered by the gate insulation layer is formed into an activated region and a region covered by the gate insulation layer is formed into a non-activated region to avoid etching the P-type ion doped layer, thus avoiding loss of the heterojunction resulting from etching. In addition, the non-activated regions are distributed in a spacing to separate the activated regions, increase a width of a depletion region, change electric field distribution between the gate region and the drain region, and increase a reverse breakdown voltage of the semi-conductor structure.

2. In an optional solution, the heterojunction includes a channel layer and a barrier layer from bottom to top. Specifically, a) there is one channel layer and one barrier layer respectively; or b) there are a plurality of channel layers and a plurality of barrier layers respectively, which are distributed alternately; or c) there is one channel layer and two or more barrier layers to satisfy different functional requirements.

3. In an optional solution, the heterojunction includes a III-nitride material. The III-nitride material may include any one or combination of GaN, AlGaN and AlInGaN. The semi-conductor structure of the present disclosure has strong compatibility with the existing HEMT device.

4. In an optional solution, a) the gate insulation layer is of a single-layer structure, and a material of the single-layer structure includes one or a mixture of two or more of SiN, AlN, AlO, AlON, SiO and HfO; or b) the gate insulation layer is of a multiple-layer stack structure, and a material of any layer in the multiple-layer stack structure includes one of SiN, AlN, AlO, AlON, SiO and HfO. In both the solution a) and the solution b), the gate insulation layer may be used a mask for activating the P-type doping ions for the following reasons: the P-type ion doped layer covered by the gate insulation layer is blocked by the gate insulation layer, so that H atoms in the P-type ion doped layer cannot overflow, and will combine with the P-type doping ions (e.g., Mg ions), that is, the P-type doping ions are passivated and cannot generate holes. However, H atoms in the P-type ion doped layer not covered by the gate insulation layer may overflow to activate the P-type doping ions.

5. In an optional solution, the P-type ion doped layer in the drain region includes a drain-region activated region, in which the P-type doping ions are activated. The drain-region activated region and the activated region in the P-type ion doped layer may be activated by the same method in a same working procedure due to process compatibility.

BRIEF DESCRIPTION OF THE DRAWINGS

FIG. 3 is a sectional view taken along a line BB in FIG. 1.

FIG. 4 is a flowchart of a method of manufacturing a semi-conductor structure according to a first embodiment of the present disclosure.

Figure 1:
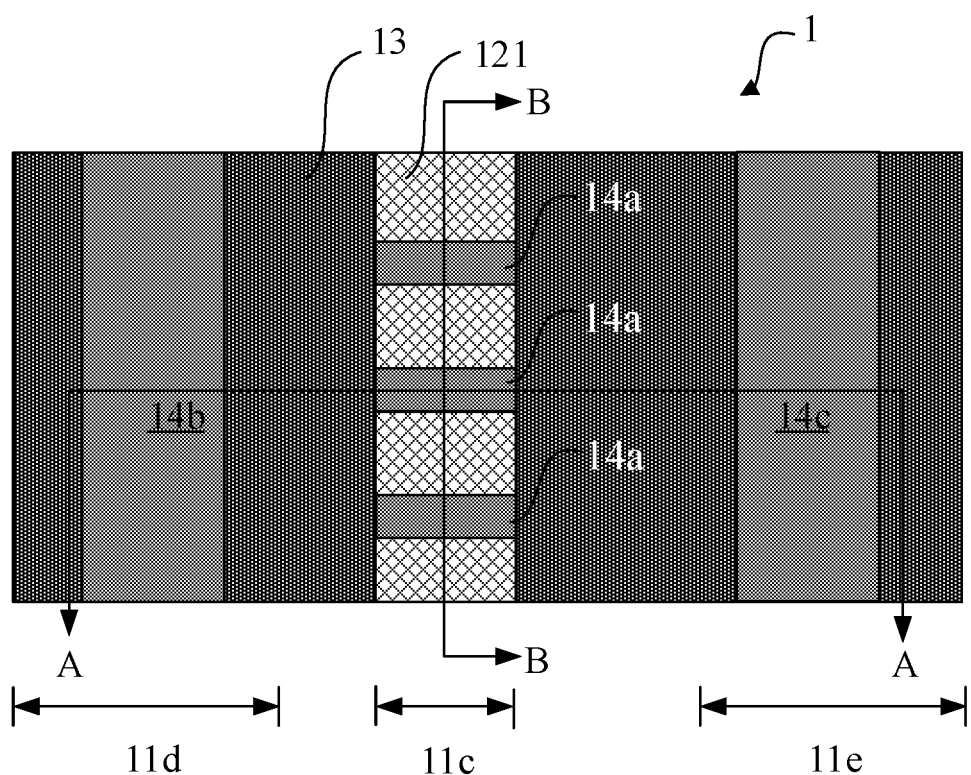
FIG. 1 is a top view of a semi-conductor structure according to a first embodiment of the present disclosure.

To facilitate understanding the present disclosure, all numerals in the drawings of the present disclosure are listed below.

| | |
|---|---|
| Semi-conductor structure 1, 2, 3, 4, 5 and 6 | Substrate 10 |
| Heterojunction 11 | Channel layer 11a |
| Barrier layer 11b | Gate region 11c |
| Source region 11d | Drain region 11e |
| P-type ion doped layer 12 | Activated region 121 |
| Non-activated region 122 | Gate insulation layer 13 |
| Gate electrode 14a | Source electrode 14b |
| Drain electrode 14c | Insulation material layer 13' |
| Drain-region activated region 123 | |

DETAILED DESCRIPTION OF THE EMBODIMENTS

To make the above objects, features and advantages of the present disclosure clearer, the specific embodiments of the present disclosure will be described in detail below in combination with accompanying drawings.

Figure 2:
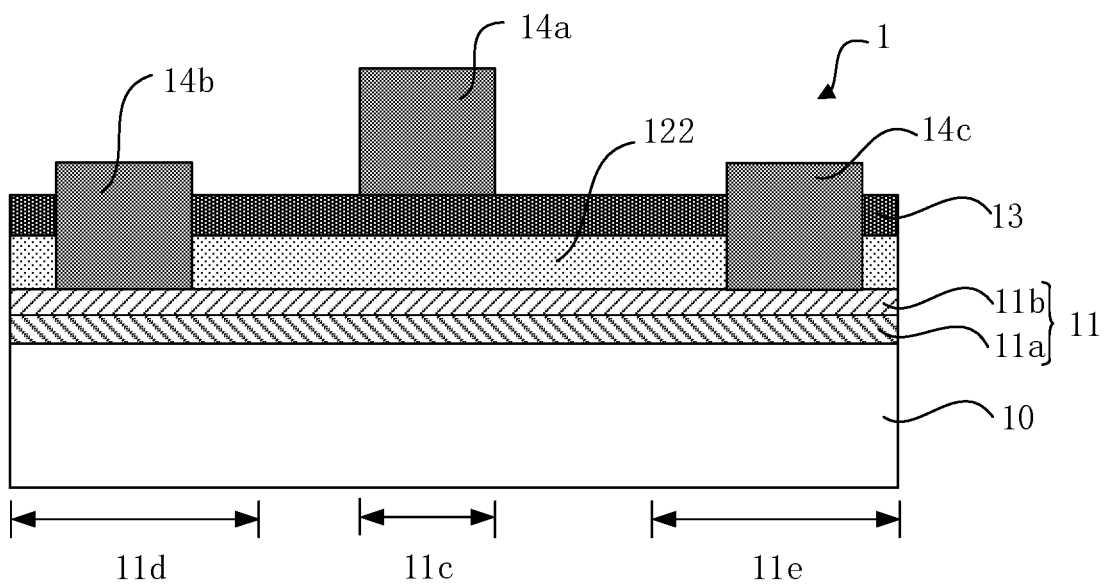
FIG. 2 is a sectional view taken along a line AA in FIG. 1.

FIG. 1 is a top view of a semi-conductor structure according to a first embodiment of the present disclosure. FIG. 2 is a sectional view taken along a line AA in FIG. 1. FIG. 3 is a sectional view taken along a line BB in FIG. 1.

As shown in FIGS. 1 to 3, the semi-conductor structure 1 includes:

a substrate 10, a heterojunction 11, a P-type ion doped layer 12 and a gate insulation layer 13 disposed from bottom to top, where the heterojunction 11 includes a source region 11d, a drain region 11e and a gate region 11c between the source region 11d and the drain region 11e; the P-type ion doped layer 12 in the gate region 11c includes an activated region 121 and non-activated regions 122, P-type doping ions in the activated region 121 are activated, and P-type doping ions in the non-activated regions 122 are passivated; the non-activated regions 122 include at least two regions which are spaced apart in a direction perpendicular to a connection line of the source region 11d and the drain region 11e; the gate insulation layer 13 is located on the non-activated regions 122 to expose the activated region 121.

The semi-conductor structure further includes a source electrode 14b, a drain electrode 14c and gate electrodes 14a, where the gate electrodes 14a are located on the gate insulation layer 13, the source electrode 14b is located in the source region 11d of the heterojunction 11, and the drain electrode 14c is located in the drain region 11e of the heterojunction 11.

A material of the substrate 10 may be sapphire, silicon carbide, silicon, diamond, GaN or one of sapphire, silicon carbide, silicon and diamond and GaN thereon.

The heterojunction 11 may include a III nitride material.

The heterojunction 11 may include a channel layer 11a and a barrier layer 11b from bottom to top. A two-dimensional electron gas may be formed at an interface of the channel layer 11a and the barrier layer 11b. In an optional solution, the channel layer 11a is an intrinsic GaN layer, and the barrier layer 11b is an N-type AlGaN layer. In another optional solution, a material combination of the channel layer 11a and the barrier layer 11b may also be GaN/AlN, GaN/InN, GaN/InAlGaN, GaAs/AlGaAs, GaN/InAlN or InN/InAlN. In addition, there is one channel layer 11a and one barrier layer 11b respectively as shown in FIG. 2; or there are a plurality of channel layers 11a and a plurality of barrier layers 11b respectively, which are distributed alternately; or there is one channel layer 11a and two or more barrier layers 11b to form a multi-barrier structure.

The source region 11d of the heterojunction 11 is used to form the source electrode 14b, the drain region 11e is used to form the drain electrode 13c, and the gate region 11c is used to form the gate electrodes 14a.

A nucleation layer and a buffer layer (not shown in figures) may also be provided between the heterojunction 11 and the substrate 10 from bottom to top. A material of the nucleation layer may be, for example, AlN and AlGaN, and the like, and a material of the buffer layer may include at least one of AlN, GaN, AlGaN and AlInGaN. The nucleation layer may alleviate the problems of lattice mismatch and thermal mismatch between an epitaxially-growing semi-conductor layer for example, the channel layer 11a in the heterojunction 11 and the substrate 10; and the buffer layer may decrease a dislocation density and a defect density of the epitaxially-growing semi-conductor layer so as to improve crystal quality.

A material of the p-type ion doped layer 12 may be a III-nitride material, for example, at least one of GaN, AlGaN and AlInGaN. The P-type doping ions may be at least one of Mg ions, Zn ions, Ca ions, Sr ions or Ba ions, to deplete the two-dimensional electron gas below the gate region so as to form an enhanced device.

The activation of the P-type doping ions in the activated region 121 refers to that the P-type doping ions may generate holes. The non-activated regions 122 refer to that the P-type doping ions are passivated and incapable of generating holes.

In the embodiments shown in FIGS. 1 to 3, the number of non-activated regions 122 is three. In other embodiments, the number of non-activated regions 122 may be two or more than three.

A plurality of non-activated regions 122 are spaced apart in a direction perpendicular to a connection line of the source region 11d and the drain region 11e, that is, in a transverse direction, so that the activated regions 121 may deplete the two-dimensional electron gas below the gate region 11c under a reverse bias condition (i.e., in an off state); the non-activated regions 122 spaced apart may isolate the activated regions 121, increase a width of a depletion region, change electric field distribution between the gate region and the drain region, and increase a reverse breakdown voltage (i.e., the breakdown voltage in the off state) of the semi-conductor structure 1.

In some embodiments, the gate insulation layer 13 may be of a single-layer structure, and a material of the single-layer structure may include one or a mixture of two or more of SiN, AlN, AlO, AlON, SiO and HfO.

In some other embodiments, the gate insulation layer 13 may be of a multiple-layer stack structure, and a material of any layer in the multiple-layer stack structure may include one of SiN, AlN, AlO, AlON, SiO and HfO.

In still some embodiments, some parts of the gate insulation layer 13 may further contain H atoms.

In FIG. 2, the source electrode 14b and the drain electrode 14c are in contact with the barrier layer 11b, and ohmic contact is formed both between the source electrode 14b and the barrier layer 11b and between the drain electrode 14c and the barrier layer 11b; Schottky contact is formed between the gate electrode 14a and the barrier layer 11b through the non-activated region 122 and the gate insulation layer 13. The source electrode 14b, the drain electrode 14c and the gate electrode 14a may be made of metals, for example, the existing conductive materials such as Ti/Al/Ni/Au and Ni/Au.

In some embodiments, the ohmic contact may be formed both between the source electrode 14b and the barrier layer 11b and between the drain electrode 14c and the barrier layer 11b by using an N-type ion heavily-doped layer. With the N-type ion heavily-doped layer, an ohmic contact layer may be directly formed between the source electrode 14b and the source region 11d of the heterojunction 11 and between the drain electrode 14c and the drain region 11e of the heterojunction 11 without employing high-temperature annealing. In this way, it is avoided that the performance of the heterojunction 11 is degraded by high temperature during annealing, and the electron mobility is lowered.

In some embodiments, the N-type ion heavily-doped layer may also be disposed in at least one of the source region 11d and the drain region 11e of the heterojunction 11. The ohmic contact layer is formed between the source region 11d of the heterojunction 11 without the N-type ion heavily-doped layer and the source electrode 14b, or between the drain region 11e of the heterojunction 11 without the N-type ion heavily-doped layer and the drain electrode 14c by high-temperature annealing.

In the N-type ion heavily-doped layer, N-type ions may be at least one kind of Si ions, Ge ions, Sn ions, Se ions and Te ions. For different kinds of N-type ions, a doping concentration may be greater than $1E19/cm^3$. The N-type ion heavily-doped layer may be a III-nitride material, for example, at least one of GaN, AlGaN and AlInGaN.

Figure 5:
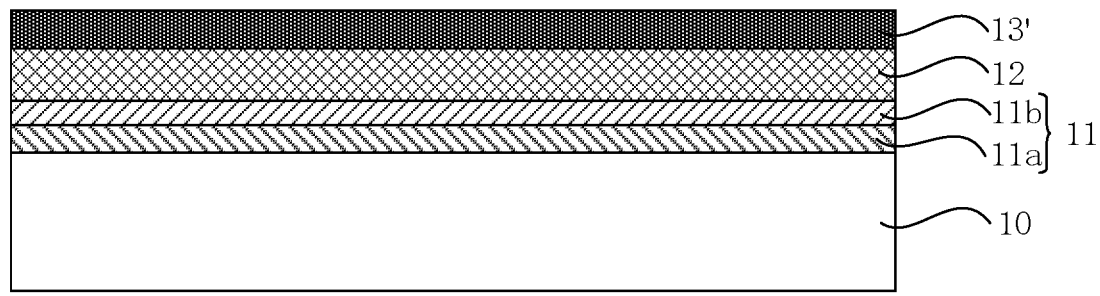
FIG. 5 is a schematic diagram of an intermediate structure corresponding to a flow in FIG. 4.

FIG. 4 is a flowchart of a method of manufacturing a semi-conductor structure according to a first embodiment of the present disclosure. FIG. 5 is a schematic diagram of an intermediate structure corresponding to a flow in FIG. 4.

Firstly, by referring to step S1 of FIG. 4, FIG. 5 and FIGS. 1 to 3, a substrate 10 is provided, on which a heterojunction 11, a P-type ion doped layer 12 and an insulation material layer 13' are sequentially formed; where the heterojunction 11 includes a source region 11d, a drain region 11e and a gate region 11c between the source region 11d and the drain region 11e.

A material of the substrate 10 may be sapphire, silicon carbide, silicon, diamond, GaN or one of sapphire, silicon carbide, silicon and diamond and GaN thereon.

The heterojunction 11 may include a III nitride material.

The heterojunction 11 may include a channel layer 11a and a barrier layer 11b from bottom to top. In an optional solution, the channel layer 11a is an intrinsic GaN layer, and the barrier layer 11b is an N-type AlGaN layer. In another optional solution, the combination of the channel layer 11a and the barrier layer 11b may also be GaN/AlN, GaN/InN, GaN/InAlGaN, GaAs/AlGaAs, GaN/InAlN or InN/InAlN. Processes used for forming the channel layer 11a and the barrier layer 11b may include: Atomic Layer Deposition (ALD), Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

There is one channel layer 11a and one barrier layer 11b respectively as shown in FIG. 5; or there are a plurality of channel layers 11a and a plurality of barrier layers 11b respectively, which are distributed alternately; or there is one channel layer 11a and two or more barrier layers 11b to form a multi-barrier structure.

Firstly, a nucleation layer and a buffer layer (not shown in figures) may also be sequentially formed before the heterojunction 11 is formed on the substrate 10; a material of the nucleation layer may be AlN or AlGaN, or the like, and a material of the buffer layer may include at least one of AlN, GaN, AlGaN and AlInGaN. The buffer layer may be formed by the same method as the heterojunction 11. The nucleation layer may alleviate a problem of lattice mismatch and thermal mismatch between an epitaxially-growing semi-conductor layer, for example, the channel layer 11a in the heterojunction 11 and the substrate 10, and the buffer layer may reduce a dislocation density and a defect density of the epitaxially-growing semi-conductor layer and improve crystal quality.

A material of the P-type ion doped layer 12 may be a III nitride material, for example, at least one of GaN, AlGaN and AlInGaN. The P-type doping ions may be at least one kind of Mg ions, Zn ions, Ca ions, Sr ions or Ba ions. The process used for forming the P-type ion doped layer 12 may be referred to the process used for forming the channel layer 11a and the barrier layer 11b.

In this embodiment, the insulation material layer 13' is formed on the P-type ion doped layer 12 without activating the P-type ion doped layer 12.

In some embodiments, the insulation material layer 13' may be of a single-layer structure, and a material of the single-layer structure may include one or a mixture of two or more of SiN, AlN, AlO, AlON, SiO and HfO.

In some other embodiments, the insulation material layer 13' may be of a multiple-layer stack structure, and a material of any layer in the multiple-layer stack structure may include one of SiN, AlN, AlO, AlON, SiO and HfO.

In still some embodiments, some parts of the insulation material layer 13' may further contain H atoms.

Next, by referring to step S2 of FIG. 4, FIG. 5 and FIGS. 1 to 3, the gate insulation layer 13 is formed by patterning the insulation material layer 13' to expose a part of the P-type ion doped layer 12; the gate insulation layer 13 includes at least two regions which are spaced apart in a direction perpendicular to a connection line of the source region 11d and the drain region 11e.

The insulation material layer 13' may be realized by dry etching or wet etching. Specifically, a patterned mask layer is firstly formed on the insulation material layer 13'. The mask layer may be a photoresist layer which is patterned by using a process of performing development after exposure. A gas for the dry etching may be $CF_4$, $C_3F_8$, or the like, and a solution for the wet etching may be hot phosphoric acid.

The gate insulation layers 13 are spaced apart in a direction perpendicular to a connection line of the source region 11d and the drain region 11e, aiming to form the non-activated regions 122 distributed in a spacing and isolate the activated regions 121.

Then, as shown in step S3 of FIG. 4, and FIGS. 1 to 3, the P-type doping ions in the exposed part of the P-type ion doped layer 12 are activated with the gate insulation layer 13 as a mask, so as to form the activated region 121.

In a process environment in which the P-type ion doped layer 12 is growing, for example, there are a large number of H atoms in an MOCVD growth environment. If the H atoms are not removed, the P-type doping ions (acceptor dopants, for example, Mg ions) in the III nitride material will be bonded with the H atoms, that is, the P-type doping ions are passivated by a large number of H atoms and will not generate holes. The P-type ion doped layer 12 is exposed to provide an escape path for releasing the H atoms.

Therefore, due to the blocking of the gate insulation layer 13, H atoms in the P-type ion doped layer 12 covered by the gate insulation layer 13 cannot overflow, and will combine with the P-type doping ions (e.g., Mg ions), that is, the P-type doping ions are passivated and cannot generate holes; the non-activated regions 122 are correspondingly formed. However, H atoms in the P-type ion doped layer 12 exposed by the gate insulation layer 13 may overflow to activate the P-type doping ions; the activated regions 121 are correspondingly formed.

It can be seen that the gate insulation layer 13 is used as a mask layer for activating the P-type doping ions so that a region of the P-type ion doped layer 12 not covered by the gate insulation layer 13 is formed into an activated region 121 and a region covered by the gate insulation layer 13 is formed into a non-activated region 122 to avoid etching the P-type ion doped layer, thus avoiding loss of the heterojunction resulting from etching.

In some embodiments, high-temperature annealing is performed in an inactive gas, for example, the P-type doping ions are activated by performing annealing at a temperature greater than 500° C. so as to prevent introduction of H atoms. In some embodiments, the P-type doping ions may be activated in a gas atmosphere containing no hydrogen atoms, for example, in a gas atmosphere of nitrogen, a mixed gas of nitrogen and oxygen, Nitrous Oxide, or argon. During high-temperature annealing, nitrogen molecules and their decomposition products may effectively penetrate into a surface of the III nitride material, thus well compensating a nitrogen vacancy caused by etching, and improving the quality of the activated region 121.

Next, as shown in step S4 of FIG. 4 and FIGS. 1 to 3, the gate electrodes 14a are formed on the gate insulation layer 13, the source electrode 14b is formed in the source region 11d of the heterojunction 11, and the drain electrode 14c is formed in the drain region 11e of the heterojunction 11.

The source electrode 14b, the drain electrode 14c and the gate electrodes 14a may be made of metals, for example, the existing conductive materials such as Ti/Al/Ni/Au and Ni/Au, and can be correspondingly formed by physical vapor deposition or chemical vapor deposition.

Before the source electrode 14b, the drain electrode 14c and the gate electrodes 14a are formed, an N-type ion heavily-doped layer (not shown in figures) may also be formed in the source region 11d and the drain region 11e of the heterojunction 11. With the N-type ion heavily-doped layer, an ohmic contact layer may be directly formed between the source electrode 14b and the source region 11d of the heterojunction 11 and between the drain electrode 14c and the drain region 11e of the heterojunction 11 without performing high-temperature annealing.

The N-type ion heavily-doped layer may be a III nitride material, for example, at least one of GaN, AlGaN and AlInGaN, and the N-type doping ions may be at least one kind of Si ions, Ge ions, Sn ions, Se ions and Te ions. The process used for forming the N-type ion heavily-doped layer may be referred to the process used for forming the channel layer 11a and the barrier layer 11b. The N-type ions may be doped along with growth, or the N-type ions may be implanted after epitaxial growth. In some embodiments, the N-type ion heavily-doped layer may be grown at a temperature lower than 1000° C., and preferably lower than 800° C., to avoid secondary passivation of the activated P-type doping ions.

In the growth process of the N-type ion heavily-doped layer, the gate insulation layer 13 may used as a mask layer to prevent formation of the N-type ion heavily-doped layer thereon.

In some embodiments, the N-type ion heavily-doped layer may also be formed in at least one of the source region 11d and the drain region 11e of the heterojunction 11.

The ohmic contact layer may be formed between the source region 11d of the heterojunction 11 without the N-type ion heavily-doped layer and the source electrode 14b or between the drain region 11e of the heterojunction 11 without the N-type ion heavily-doped layer and the drain electrode 14c by high-temperature annealing.

Figure 6:
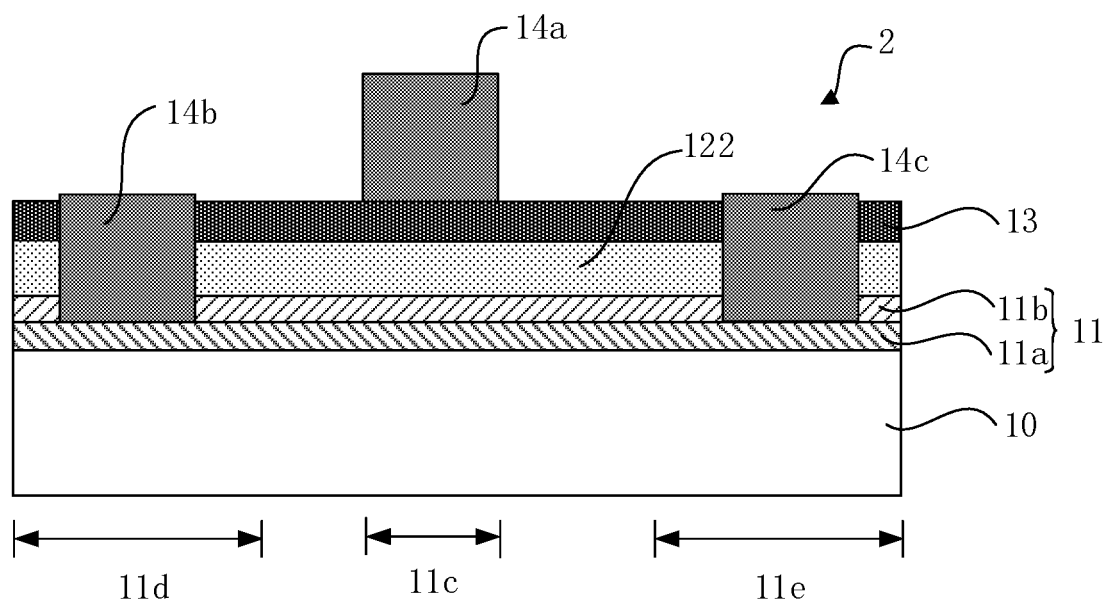
FIG. 6 is a sectional structural schematic diagram of a semi-conductor structure according to a second embodiment of the present disclosure.

FIG. 6 is a sectional structural schematic diagram of a semi-conductor structure according to a second embodiment of the present disclosure.

As shown in FIG. 6 and FIGS. 1 to 3, the semi-conductor structure 2 in the second embodiment is substantially same as the semi-conductor structure 1 in the first embodiment, except that: the source electrode 14b and the drain electrode 14c are in contact with the channel layer 11a, and ohmic contact is formed between the source electrode 14b and the channel layer 11a and between the drain electrode 14c and the channel layer 11a.

Correspondingly, a method of manufacturing the semi-conductor structure 2 in the second embodiment is substantially same as the method of manufacturing the semi-conductor structure 1 in the first embodiment, except that: at step S4, when the source electrode 14b and the drain electrode 14c are formed respectively in the source region 11d and the drain region 11e of the heterojunction 11, the gate insulation layer 13, the P-type ion doped layer 12 (which specifically are the non-activated regions 122) and the barrier layer 11b in the source region 11d and the drain region 11e are removed to expose the channel layer 11a.

In some embodiments, the ohmic contact may also be formed both between the source electrode 14b and the channel layer 11a and between the drain electrode 14c and the channel layer 11a by using the N-type ion heavily-doped layer. With the N-type ion heavily-doped layer, the ohmic contact layer may be directly formed between the source electrode 14b and the channel layer 11a and between the drain electrode 14c and the channel layer 11a without high-temperature annealing.

In some embodiments, the ohmic contact may be formed between the source electrode 14b and the channel layer 11a or between the drain electrode 14c and the channel layer 11a by using the N-type ion heavily-doped layer. The ohmic contact layer may be formed between the channel layer 11a without the N-type ion heavily-doped layer and the source electrode 14b or between the channel layer 11a without the N-type ion heavily-doped layer and the drain electrode 14c by high-temperature annealing.

Figure 7:
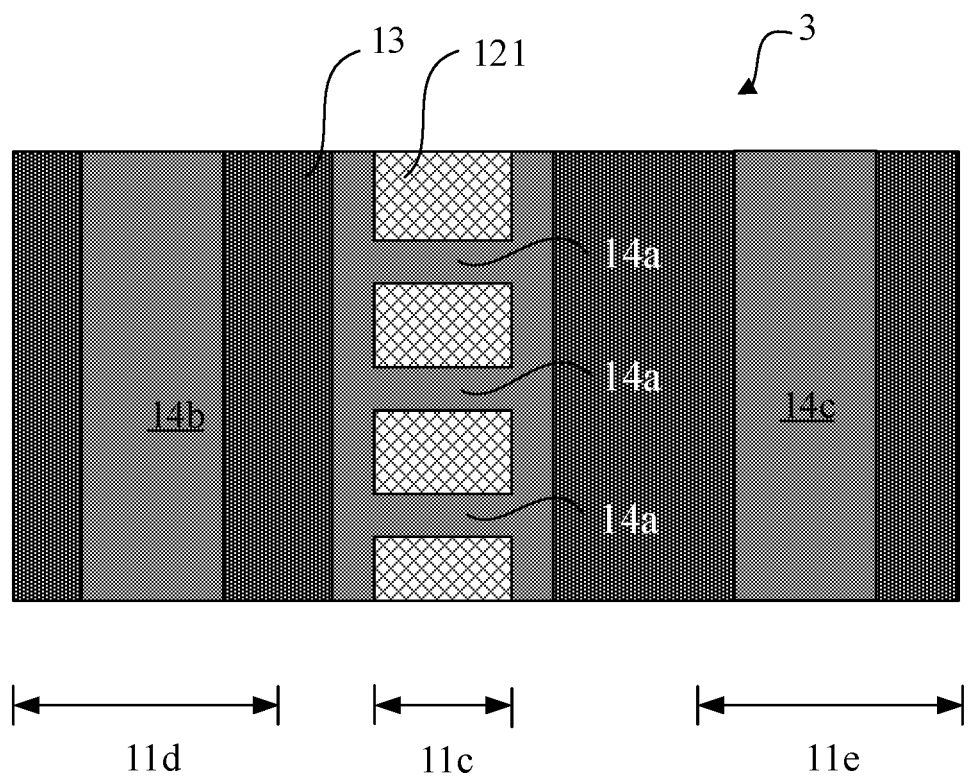
FIG. 7 is a top view of a semi-conductor structure according to a third embodiment of the present disclosure.

FIG. 7 is a top view of a semi-conductor structure according to a third embodiment of the present disclosure.

As shown in FIG. 7, FIG. 6 and FIGS. 1 to 3, the semi-conductor structure 3 in the third embodiment is substantially same as the semi-conductor structures 1 and 2 in the first and second embodiments, except that different gate electrodes 14a are electrically connected together.

Different gate electrodes 14a are electrically connected together to facilitate applying a voltage to each gate electrode 14a.

Specifically, an electrically-connected layer may be disposed at both ends of each gate electrode 14a respectively to electrically connect each gate electrode 14a. The electrically-connected layer and the gate electrode 14a may be located at a same layer and manufactured in the same working procedure.

In some embodiments, the above electrically connected layer may also be disposed only at one end of each gate electrode 14a.

In still some embodiments, the above electrically connected layer may also be disposed above each gate electrode 14a, and is electrically insulated from the activated region 121 through an insulation layer.

Figure 8:
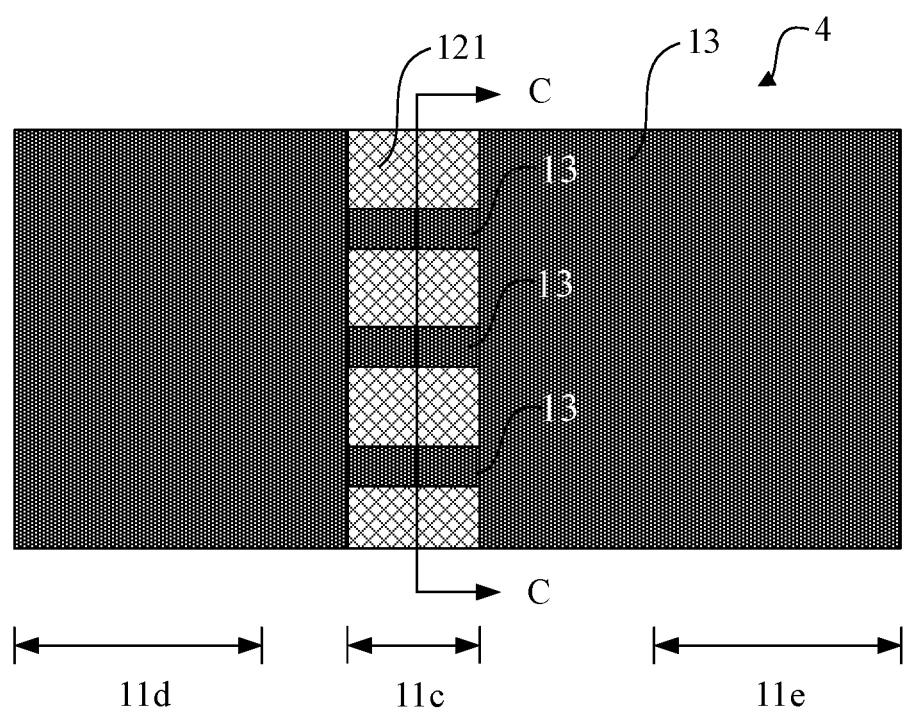
FIG. 8 is a top view of a semi-conductor structure according to a fourth embodiment of the present disclosure.
Figure 9:
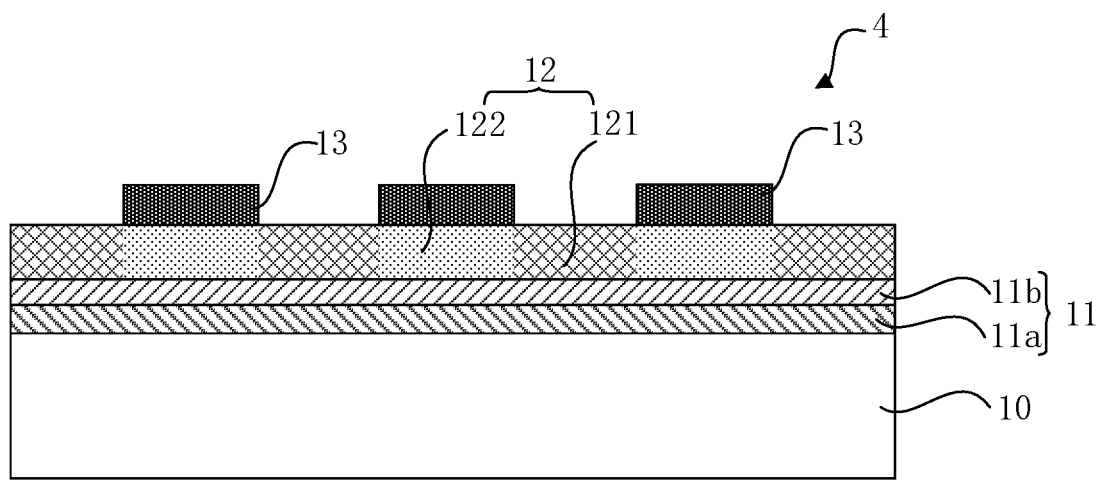
FIG. 9 is a sectional view taken along a line CC in FIG. 8.

FIG. 8 is a top view of a semi-conductor structure according to a fourth embodiment of the present disclosure. FIG. 9 is a sectional view taken along a line CC in FIG. 8.

As shown in FIG. 8, FIG. 9, FIG. 7, FIG. 6 and FIGS. 1 to 3, the semi-conductor structure 4 in the fourth embodiment is substantially same as the semi-conductor structures 1, 2 and 3 in the first, second and third embodiments, except that the semi-conductor structure 4 is an intermediate semi-conductor structure, in which the gate electrodes 14a, the source electrode 14b and the drain electrode 14c are not manufactured.

Correspondingly, a method of manufacturing the semi-conductor structure 4 in the fourth embodiment is substantially same as the methods of manufacturing the semi-conductor structures 1, 2 and 3 in the first, second and third embodiments, except that step S4 is omitted.

The semi-conductor structure 4 may be produced and sold as semi-finished product.

Figure 10:
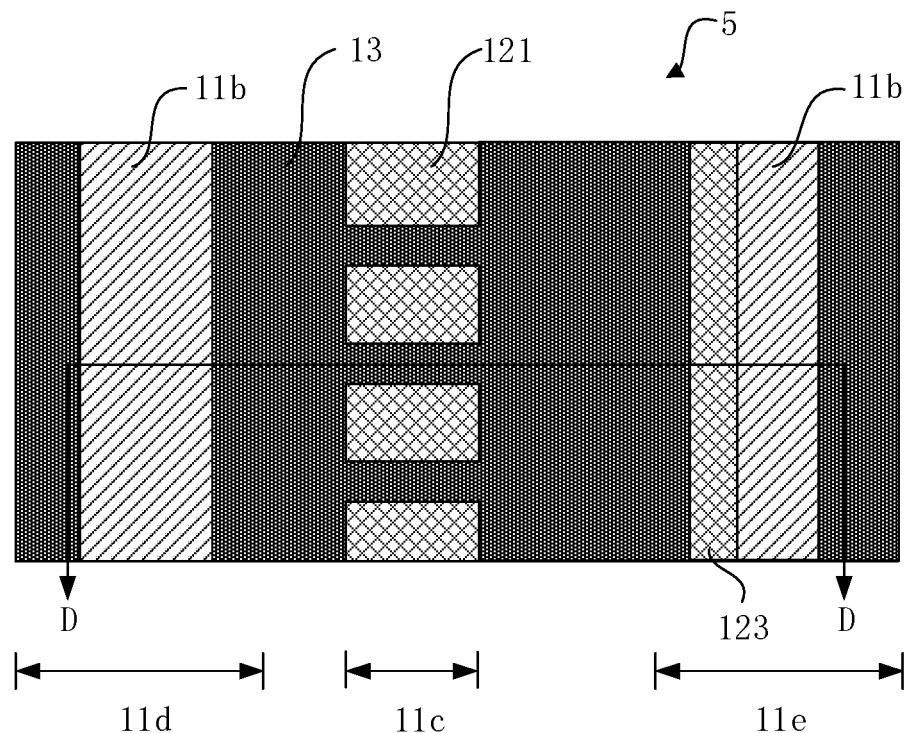
FIG. 10 is a top view of a semi-conductor structure according to a fifth embodiment of the present disclosure.
Figure 11:
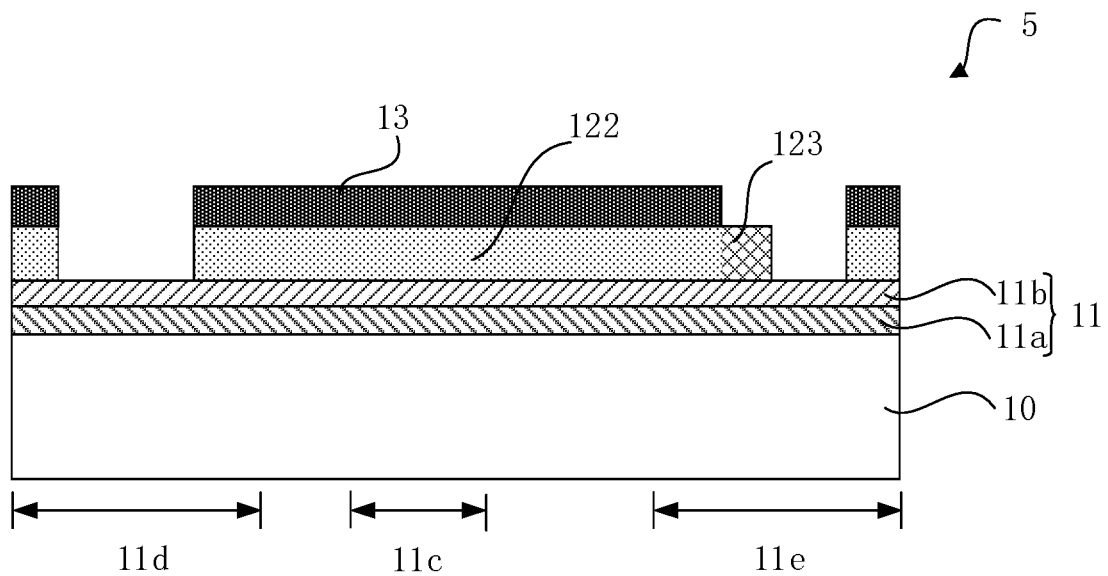
FIG. 11 is a sectional view taken along a line DD in FIG. 10.

FIG. 10 is a top view of a semi-conductor structure according to a fifth embodiment of the present disclosure. FIG. 11 is a sectional view taken along a line DD in FIG. 10.

As shown in FIG. 10, FIG. 11, FIG. 8 and FIG. 9, the semi-conductor structure 5 in the fifth embodiment is substantially same as the semi-conductor structure 4 in the fourth embodiment, except that the P-type ion doped layer 12 in the drain region 11e includes a drain-region activated region 123, in which P-type doping ions are activated.

A size of the drain-region activated region 123 is smaller than a size of the drain region 11e to expose a part of the drain region 11e.

For the manufacturing method, the drain-region activated region 123 and the activated region 121 in the P-type ion doped layer 12 may be activated by the same method in a same working procedure due to process compatibility.

The semi-conductor structure 5 may be produced and sold as semi-finished product.

Figure 12:
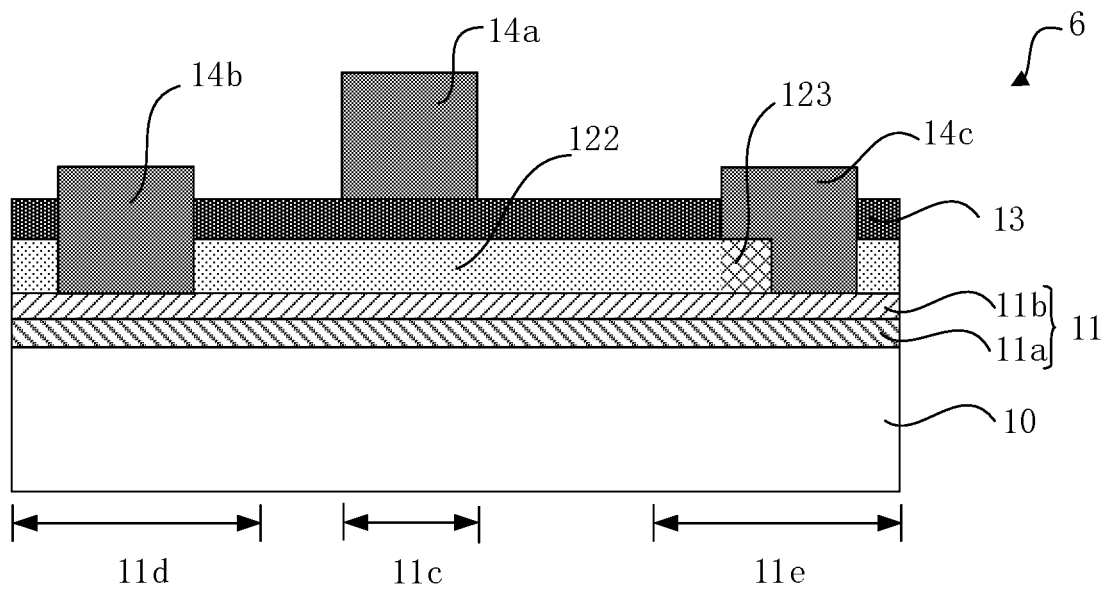
FIG. 12 is a sectional structural schematic diagram of a semi-conductor structure according to a sixth embodiment of the present disclosure.

FIG. 12 is a sectional structural schematic diagram of a semi-conductor structure according to a sixth embodiment of the present disclosure.

As shown in FIG. 12, FIG. 10, and FIG. 11, the semi-conductor structure 6 in the sixth embodiment is substantially same as the semi-conductor structure 5 in the fifth embodiment, except that the semi-conductor structure 5 further includes the source electrode 14b, the drain electrode 14c and the gate electrodes 14a, the gate electrodes 14a is located on the gate insulation layer 13, the source electrode 14b is located in the source region 11d, and the drain electrode 14c is located in the drain-region activated region 123 and the drain region 11e.

The source electrode 14b, the drain electrode 14c and the gate electrodes 14a may be made of metals, for example, the existing conductive materials such as Ti/Al/Ni/Au and Ni/Au, and may be correspondingly formed by physical vapor deposition or chemical vapor deposition.

The semi-conductor structure 6 in the sixth embodiment may also be combined with the semi-conductor structure 3 in the third embodiment to electrically connect a plurality of gate electrodes 14a together.

The foregoing disclosure is merely illustrative of the present disclosure but not intended to limit the present disclosure. Various changes and modifications may be made by any person skilled in the art without departing from the spirit and scope of the present disclosure, and therefore, the scope of protection of the present disclosure shall be subjected to the scope defined by the claims.

The invention claimed is:

1. A semi-conductor structure, comprising:
a substrate, a heterojunction, a P-type ion doped layer and a gate insulation layer disposed from bottom to top;
wherein the heterojunction comprises: a source region, a drain region and a gate region between the source region and the drain region,
the P-type ion doped layer in the gate region comprises an activated region and non-activated regions,
P-type doping ions in the activated region are activated, P-type doping ions in the non-activated regions are passivated,
the non-activated regions comprise at least two regions which are spaced apart in a direction perpendicular to a connection line of the source region and the drain region, and
the gate insulation layer is located on the non-activated regions to expose the activated region.

2. The semi-conductor structure according to claim 1, further comprising: a source electrode, a drain electrode and gate electrodes, wherein the gate electrodes are located on the gate insulation layer, the source electrode is located in the source region of the heterojunction, and the drain electrode is located in the drain region of the heterojunction.

3. The semi-conductor structure according to claim 2, wherein the gate electrodes are electrically connected together.

4. The semi-conductor structure according to claim 1, wherein the P-type ion doped layer in the drain region comprises a drain-region activated region, in which P-type doping ions are activated.

5. The semi-conductor structure according to claim 4, further comprising: a source electrode, a drain electrode and gate electrodes, wherein the gate electrodes are located on the gate insulation layer, the source electrode is located in the source region, and the drain electrode is located in the drain-region activated region and the drain region.

6. The semi-conductor structure according to claim 5, wherein the gate electrodes are electrically connected together.

7. The semi-conductor structure according to claim 1, wherein the heterojunction comprises a channel layer and a barrier layer from bottom to top.

8. The semi-conductor structure according to claim 2, wherein the heterojunction comprises a channel layer and a barrier layer from bottom to top; the source electrode and the drain electrode are in contact with the channel layer or the barrier layer.

9. The semi-conductor structure according to claim 1, wherein a material of the P-type ion doped layer comprises a III nitride material.

10. The semi-conductor structure according to claim 1, wherein the gate insulation layer is of a single-layer structure or a multiple-layer stack structure.

11. A method of manufacturing the semi-conductor structure according to claim 1, comprising:
providing the substrate;
sequentially forming the heterojunction, the P-type ion doped layer and an insulation material layer on the substrate;
forming the gate insulation layer by patterning the insulation material layer to expose a part of the P-type ion doped layer, wherein the gate insulation layer comprises the at least two regions which are spaced apart in the direction perpendicular to the connection line of the source region and the drain region; and
forming the activated region by activating the P-type doping ions in the exposed part of the P-type ion doped layer with the gate insulation layer as a mask.

12. The method according to claim 11, wherein the P-type doping ions are activated by annealing at a temperature greater than 500° C.

13. The method according to claim 12, wherein the P-type doping ions are activated in an atmosphere of nitrogen, a mixed gas of nitrogen and oxygen, nitrous oxide or argon.

14. The method according to claim 11, further comprising:
forming gate electrodes on the gate insulation layer;
forming a source electrode in the source region of the heterojunction; and
forming a drain electrode in the drain region of the heterojunction.

15. The method according to claim 11, wherein when the P-type doping ions in the exposed part of the P-type ion doped layer are activated with the gate insulation layer as a mask, the method further comprises:
activating the P-type ion doped layer in the drain region to form a drain-region activated region.

16. The method according to claim 15, further comprising:
   forming gate electrodes on the gate insulation layer;
   forming a source electrode in the source region; and
   forming a drain electrode in the drain-region activated region and the drain region.

17. The method according to claim 11, wherein the heterojunction comprises a channel layer and a barrier layer from bottom to top.

18. The method according to claim 14, wherein the heterojunction comprises a channel layer and a barrier layer from bottom to top; the source electrode and the drain electrode are in contact with the channel layer or the barrier layer.

19. The method according to claim 11, wherein a material of the P-type ion doped layer comprises a III nitride material.

20. The method according to claim 11, wherein the gate insulation layer is of a single-layer structure or a multiple-layer stack structure.

* * * * *